United States Patent
Lai et al.

(10) Patent No.: US 9,651,736 B2
(45) Date of Patent: May 16, 2017

(54) SELF-ALIGNMENT DUE TO WETTABILITY DIFFERENCE OF AN INTERFACE

(71) Applicant: Taiwan Semiconductor Manufacturing Co. Ltd., Hsin-Chu (TW)

(72) Inventors: Jay Lai, Taoyuan (TW); Ying-Hao Kuo, Hsinchu (TW); Hai-Ching Chen, Hsinchu (TW); Tien-I Bao, Dayuan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 130 days.

(21) Appl. No.: 14/477,917

(22) Filed: Sep. 5, 2014

(65) Prior Publication Data
US 2014/0376858 A1    Dec. 25, 2014

Related U.S. Application Data

(62) Division of application No. 13/751,540, filed on Jan. 28, 2013, now Pat. No. 8,828,484.

(51) Int. Cl.
*G02B 6/122*    (2006.01)
*G03F 7/00*    (2006.01)
(Continued)

(52) U.S. Cl.
CPC .............. *G02B 6/122* (2013.01); *B05D 5/06* (2013.01); *G02B 6/425* (2013.01); *G02B 6/4298* (2013.01);
(Continued)

(58) Field of Classification Search
CPC ...... G02B 6/122; G02B 6/425; G02B 6/4298; G02B 2006/12102; G02B 2006/12173;
(Continued)

(56) References Cited

U.S. PATENT DOCUMENTS 5,707,684 A * 1/1998 Hayes ..................... B29C 41/36
347/1
2003/0087073 A1    5/2003 Kobayashi
(Continued)

OTHER PUBLICATIONS

Chien, C.H., et al. "A study of the geometry of microball lens arrays using the novel batch-fabrication technique." Sensors and Actuators. vol. 122, Issue 1, Jul. 29, 2005, pp. 55-63. 9 Pages.
(Continued)

*Primary Examiner* — Ryan Lepisto
*Assistant Examiner* — Erin Chiem
(74) *Attorney, Agent, or Firm* — Eschweiler & Potashnik, LLC (57) ABSTRACT

Some embodiments relate to a method of processing a workpiece. The workpiece includes a first surface region having a first wettability coefficient, and a second surface region having a second wettability coefficient that differs from the first wettability coefficient. A liquid, which corresponds to an optical structure, is dispensed on the first and second surface regions of the workpiece, wherein the liquid self-aligns to the second surface region due to the difference between the first and second wettability coefficients. The self-aligned liquid is hardened to form the optical structure.

20 Claims, 7 Drawing Sheets

(51) Int. Cl.
*G02B 6/42* (2006.01)
*G02B 6/12* (2006.01)
*B05D 5/06* (2006.01)

(52) U.S. Cl.
CPC .. *G03F 7/0002* (2013.01); *G02B 2006/12102* (2013.01); *G02B 2006/12173* (2013.01); *Y10T 428/24612* (2015.01)

(58) Field of Classification Search
CPC .. G03F 7/0002; B05D 5/06; Y10T 428/24612
See application file for complete search history.

(56) References Cited

U.S. PATENT DOCUMENTS

| | | | |
|---|---|---|---|
| 2004/0106223 A1* | 6/2004 | Kaneko | B29D 11/00278 438/29 |
| 2004/0169004 A1* | 9/2004 | Kanbe | B41M 3/006 216/4 |
| 2005/0052751 A1 | 3/2005 | Liu et al. | |
| 2008/0068718 A1* | 3/2008 | Yu | B29D 11/00365 359/620 |
| 2008/0186585 A1* | 8/2008 | Mino | G02B 3/0012 359/620 |
| 2010/0209680 A1* | 8/2010 | Kobayashi | B82Y 30/00 428/209 |

OTHER PUBLICATIONS

Non-Final Office Action dated Nov. 21, 2013 for U.S. Appl. No. 13/751,540.
Notice of Allowance dated May 15, 2014 for U.S. Appl. No. 13/751,540.

\* cited by examiner

SELF-ALIGNMENT DUE TO WETTABILITY DIFFERENCE OF AN INTERFACE

REFERENCE TO RELATED APPLICATION

This application is a divisional of U.S. application Ser. No. 13/751,540 filed on Jan. 28, 2013.

BACKGROUND

Image sensors typically include an array of electronic sensing elements, each of which is capable of detecting one or more pre-determined wavelengths of electromagnet radiation (e.g., visible light). Each electronic sensing element of the array provides a signal indicating what wavelength of light, if any, it has detected, such that the array of sensing elements provide a number of signals which are collectively representative of an image. These signals are routed from the array using an optical interconnect structure, which has a series of optical pathways that carry electromagnetic radiation (e.g., visible light) much in the same way as metal wires carry current or voltage. Because this optical interconnect includes many pathways to carry signals from the tightly packed sensing elements of the array, it is desirable for the optical interconnect to be tightly packed.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Traditionally, optical interconnect structures are patterned using photolithography to pattern the optical layers or using "pick-and-place" techniques (where pre-built optical structures are mechanically picked up and placed at a desired position on a workpiece). Unfortunately, these conventional techniques are less than ideal. In photolithography techniques, the polymers used to form optical interconnect have needed to be photo-sensitive; and unfortunately, this rules out the use of other, non-photosensitive materials for the optical interconnect. In addition, although pick-in-place technologies can use non-photosensitive materials for the optical interconnect, these pick-in-place technologies are limited in the precision with which interconnect components can be positioned on the workpiece. To arrange optical components with greater precision and with more material options than previously available, improved techniques for manufacturing optical components and connector assemblies are disclosed herein. These techniques provide self-alignment of optical structures based on wettability differences of a surface interface.

Figure 1:
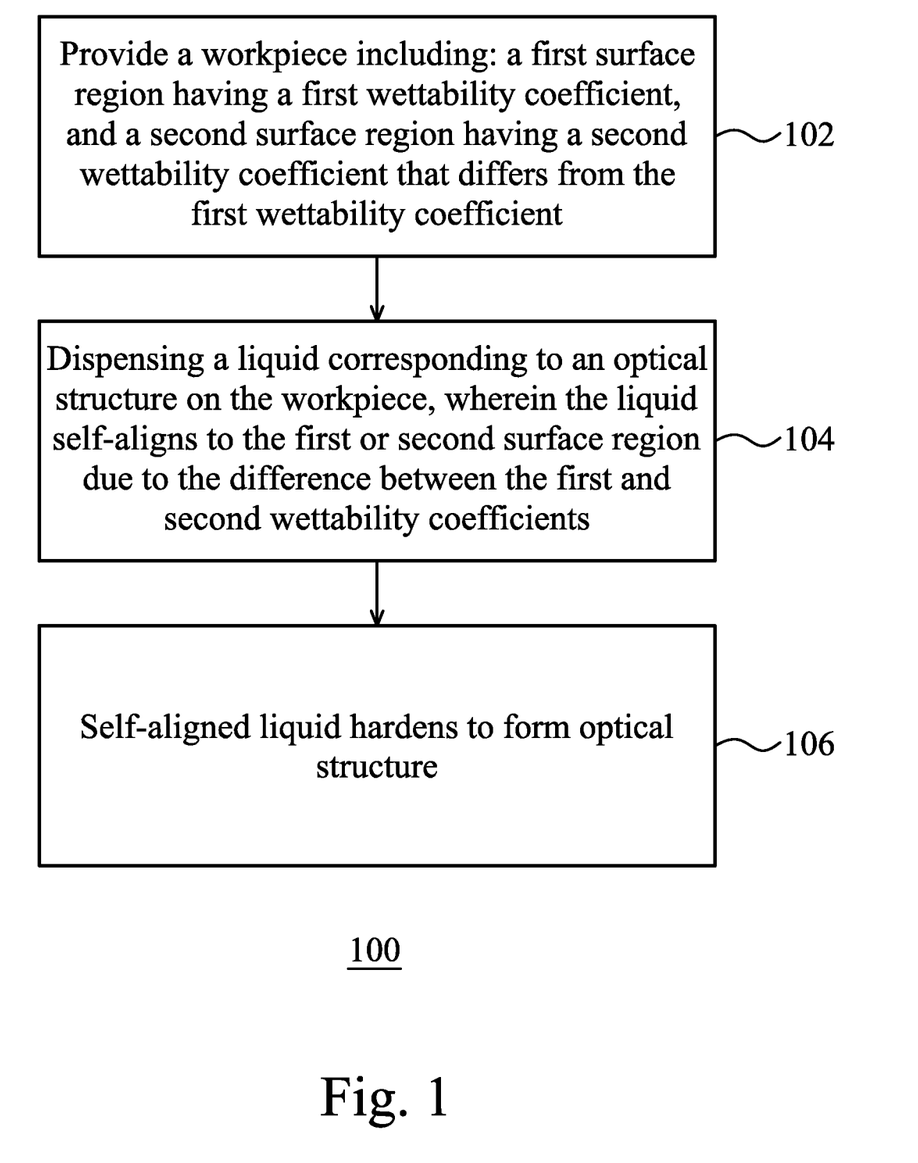
FIG. 1 shows a flow diagram of a method for manufacturing an optical device in accordance with some embodiments.

FIG. 1 illustrates a somewhat general method 100 in accordance with some embodiments. FIG. 1 starts at 102, wherein a workpiece is provided. The workpiece includes a first surface region having a first wettability coefficient, and a second surface region having a second, different wettability coefficient. In 104, a liquid, which corresponds to an optical structure to be formed on the workpiece, is dispensed on the first and second surface regions of the workpiece. Due to the difference between the first and second wettability coefficients, the liquid self-aligns to the first or second surface region. In 106, the self-aligned liquid then hardens to form the optical structure. In some implementations, for example, this optical structure can correspond to a waveguide and/or ball lens, which allow light of a pre-determined wavelength to pass through with little or no loss in intensity and which have a refractive index that is greater than that of the ambient environment. In some implementations, the first and/or second surface regions can be made by photolithography, and the self-aligned liquids used to make the optical structure are non-photosensitive.

Because the self-alignment techniques of FIG. 1 allow liquids to be self-aligned on precisely positioned surface regions which can be formed by photolithography, these techniques provide high precision alignment. Further, because the self-aligned liquids need not be photosensitive, this approach allows engineers to use a wide variety of materials (including non-photosensitive materials that can be dispensed in the liquid state) to form the optical structures. This is advantageous because some of these materials may provide good optical performance, for example, low losses and/or desirable indices of refraction, for predetermined wavelengths of interest. Thus, the disclosed self-alignment techniques are believed to be an improvement in some regards over traditional lithography techniques and pick-and-place techniques.

Figure 2A:
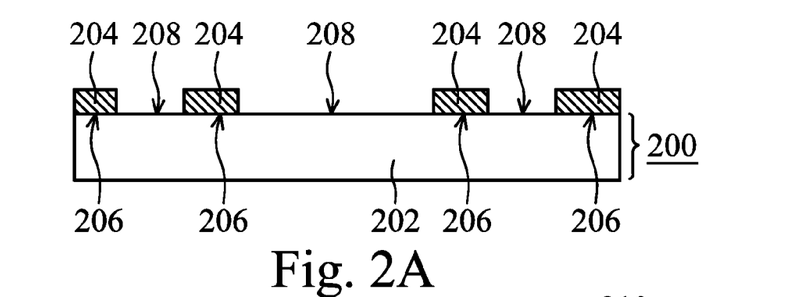
FIGS. 2A-2D show a series of cross-sectional views illustrating some embodiments of a method for manufacturing an optical device.

FIGS. 2A-2D show some embodiments of techniques for manufacturing an optical component. In FIG. 2A, the method starts when a workpiece 200 is provided. The workpiece 200 can include a substrate 202 on which one or more layers are formed. A mask layer 204 is formed over the substrate 202. The mask layer 204 is patterned to define first surface regions 206, which are for example covered by the mask 204, and second surface regions 208, which are left exposed through apertures in the mask. In other embodiments, the first surface regions could be left exposed through the apertures and the second surface regions could be covered by the mask.

The substrate 202 can be a bulk semiconductor substrate (e.g., bulk silicon wafer), a binary compound substrate (e.g., GaAs), a ternary compound substrate (e.g., AlGaAs), or higher order compound substrates, among others; but can also be made of non-semiconductor materials, such as glass. The substrate 202 can also include a combination of semiconductor material and non-semiconductor material. For example, a bulk semiconductor substrate can also include non-semiconductor materials such as oxide in silicon-on-insulator (SOI), partial SOI substrate, and organic materials, as well as polysilicon, and amorphous silicon, among others. In some embodiments, the substrate 202 can include multiple wafers or dies which are stacked or otherwise adhered together. The substrate 202 can include wafers which are cut from a silicon ingot, and/or any other type of semiconductor/non-semiconductor and/or deposited or grown (e.g. epitaxial) layers formed on an underlying substrate.

Figure 2B:
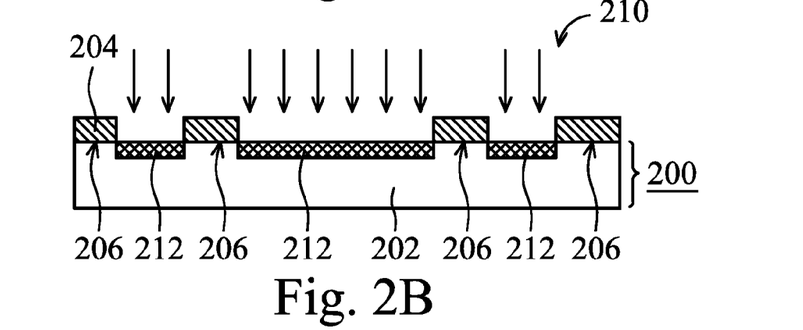

In FIG. 2B, while the mask layer 204 is in place, a surface treatment 210 is carried out to form surface treated regions 212. The surface treatment 210 changes the wettability of the surface treated regions 212 (e.g., second (e.g., uncovered) surface regions 208 in FIG. 2A), relative to untreated surface regions (e.g., first (e.g., covered) surface 206 regions in FIG. 2A). For example, in some embodiments the surface treatment 210 comprises a plasma treatment and the surface treated regions 212 are plasma-modified regions. In other embodiments, a wet rinse or vapor treatment, such as HMDS for example, can change the wettability. The plasma-modified regions have a second wettability coefficient that is different from (e.g., higher than) a first wettability coefficient associated with the untreated surface regions (e.g., first surface regions 206 in FIG. 2A).

Figure 2C:
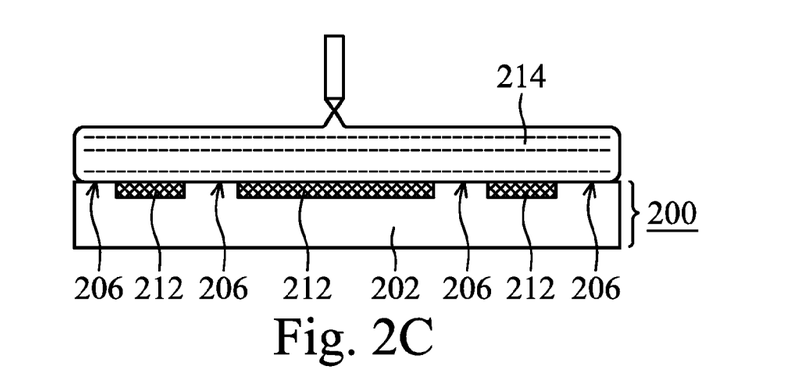

In FIG. 2C, the mask 204 is removed to re-expose the untreated surface regions 206, and a liquid 214 corresponding to an optical component is dispensed over the surface treated regions 212 and untreated surface regions 206. Depending on the implementation, the liquid can be dispensed over the entire substrate surface or can alternatively be dispensed over less than the entire substrate surface. For example, the liquid can be disposed on an area only slightly larger than the surface treated regions 212, which can also be referred to as landing pads.

Figure 2D:
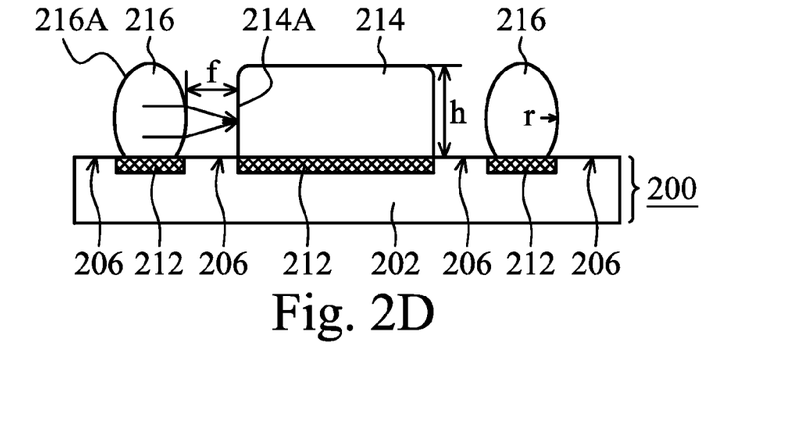

As shown in FIG. 2D, due to the wettability difference between the surface treated regions 212 and untreated surface regions 206, the dispensed liquid tends to self-align with the surface treated regions 212. In other embodiments, liquid could self-align to un-treated surface regions 206. The self-aligned liquid then hardens, for example by baking the self-aligned liquid at a low temperature and then performing a cure at a higher temperature, to form the optical structure. In the illustrated embodiment, the optical structure can include a waveguide 214, which can be relatively box-like in shape, and ball lens(es) 216, each of which is relatively spherical or dome-like in shape. The optical structures are made of a material that has a refractive index that is greater than that of the ambient environment so as to "bend", divert, focus or collimate entering or exiting electromagnetic radiation while allowing electromagnetic radiation of a predetermined wavelength (e.g., visible light) to pass therethrough with little or no loss in intensity. The curved outer surface 216A of ball lens 216, for example, causes light passing through the ball lens 216 to be steered inward until the light is focused at a focal length, f, of the lens. Because of this, an edge of the waveguide 214A nearest the ball lens 216 is often spaced apart from the ball lens' outer surface 216A by the focal length, f, thereby promoting strong optical coupling between the ball lens 216 and the waveguide 214.

For example, in some implementations, a ball lens 216 can have a radius, r, of about 25-500 µm, or approximately 25-100 µm; the waveguide 214 can have a height, h, of about 20-150 µm, or approximately 20-40 µm; and the spacing of focal length, f, between the ball lens 216 and waveguide edge 214A can be approximately 100 µm, although many other dimensions could also be used.

Figure 3A:
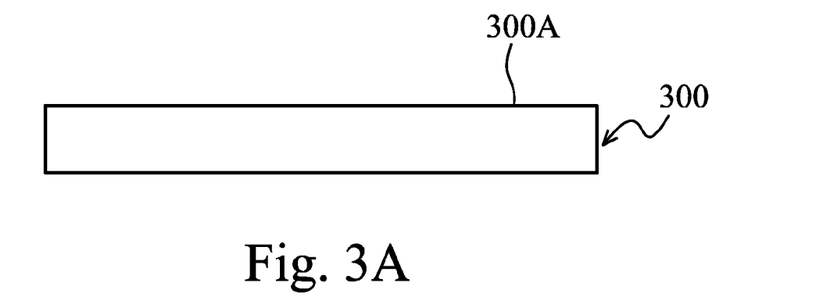
FIGS. 3A-3D show a series of cross-sectional views illustrating some embodiments of a method for manufacturing an optical device.

FIGS. 3A-3D show another embodiment of techniques for manufacturing an optical component. In FIG. 3A, the method starts when a workpiece, which includes a substrate 300, is provided. As previously discussed with regards to FIG. 2A, the substrate 300 can take many forms, including a semiconductor substrate or glass substrate, among others. The substrate 300 has an exposed substrate surface 300A which has a first wettability coefficient.

Figure 3B:
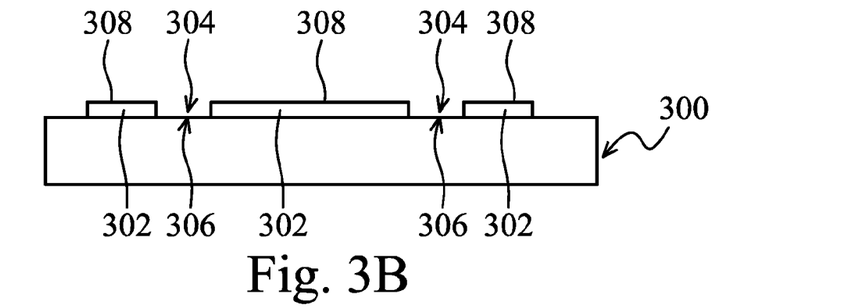

In FIG. 3B, a landing layer 302 is formed over the substrate 300. The landing layer 302 is patterned to include openings 304 corresponding to exposed surface regions 306 (e.g., first surface regions), which have the first wettability coefficient-for example the native wettability coefficient of the substrate surface 300A. The landing surface regions 308 (e.g., second surface region) exhibit a second wettability coefficient, which is different from that of the exposed surface regions 306. Typically, the landing layer 302 is patterned using lithography techniques, which provide good precision in placement.

Figure 3C:
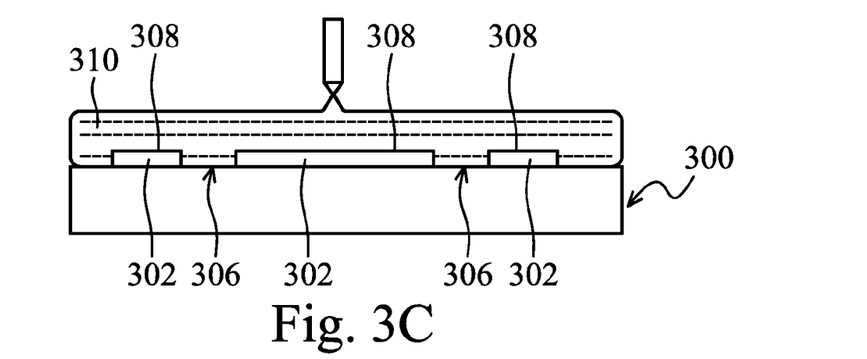

In FIG. 3C, a liquid 310 corresponding to an optical component is dispensed over the exposed surface regions 306 and the landing surface regions 308.

Figure 3D:
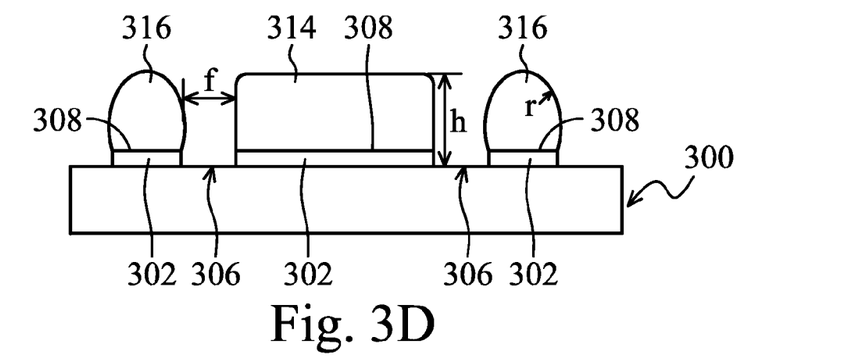

As shown in FIG. 3D, due to the wettability difference between the landing surface regions 308 and the exposed surface regions 306, the dispensed liquid tends to self-align with the landing surface regions 308. The self-aligned liquid is then hardened, for example by baking the self-aligned liquid at a low temperature and then performing a cure at a higher temperature, to form the optical structure. In the illustrated embodiment, the optical structure can correspond to a waveguide 314, which can be relatively box-like in shape, and ball lens(es) 316, each of which is relatively spherical or dome-like in shape, as previously discussed with regards to FIGS. 2A-2D, for example.

Because the self-alignment techniques of FIGS. 2-3 allow a wide variety of materials, in the liquid state, to be self-aligned to precisely positioned surface regions which can be formed by photolithography, this approach allows engineers to use a wide variety of liquids (including non-photosensitive materials) to form the optical structures. This is advantageous because some of these liquids may provide good optical performance, for example, low losses and/or desirable indices of refraction, for predetermined wavelengths of interest. At the same time, these techniques also provide high precision alignment and good optical coupling, due to the fact that photolithographic patterns still underlie the surface regions which are used for alignment.

FIG. 4A-4D show another embodiment of manufacturing an optical structure, which is similar to FIG. 2 in some regards, but which attaches an optical fiber to the substrate as well.

Figure 4A:
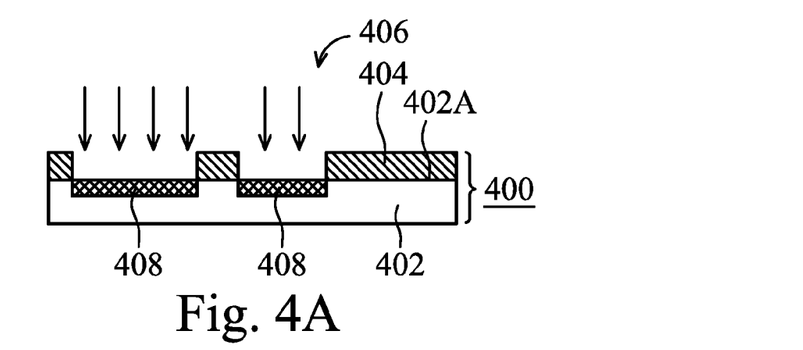
FIGS. 4A-4D show a series of cross-sectional views illustrating some embodiments of a method for manufacturing an optical device on a workpiece and connecting an optical fiber to the workpiece.
Figure 4B:
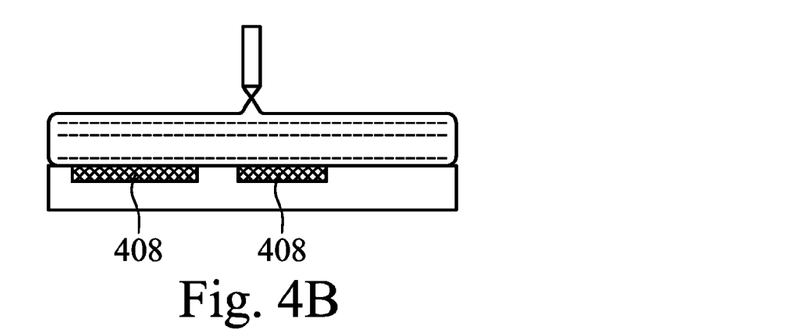

In FIG. 4A, the method starts with a workpiece 400, which includes a substrate 402 having a substrate surface 402A on which a mask layer 404 is formed. The mask layer 404 is typically made of photoresist, but could also be a nitride mask, oxide, or other hardmask. While the mask 404 is in place, a surface treatment 406 is carried out to form surface treated regions 408 in the substrate.

In some embodiments, the surface treatment 406 is a plasma treatment that renders the surface treated regions 408 hydrophilic, relative to the un-treated substrate surface covered by mask 404. For example, in FIG. 4B-4C the plasma treatment can make the surface treated regions 408 a hydrophilic interface that includes F—, Cl— and CH4 atoms. The plasma can be somewhat weak and usually less than 100 W RF power, though this can vary depending on plasma tool design. In some such embodiments, the time for which the plasma is applied can range from around 10 second to a few minutes.

Figure 4C:
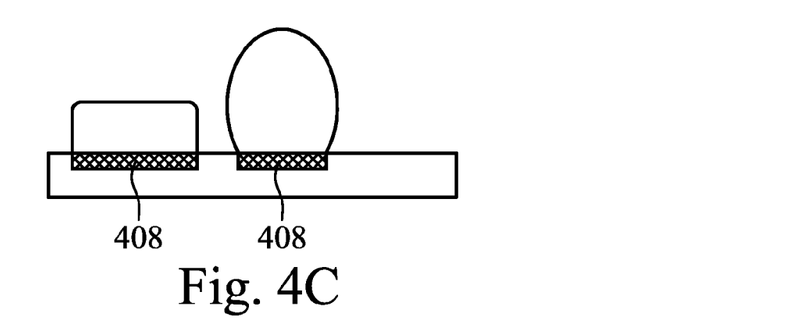
Figure 4D:
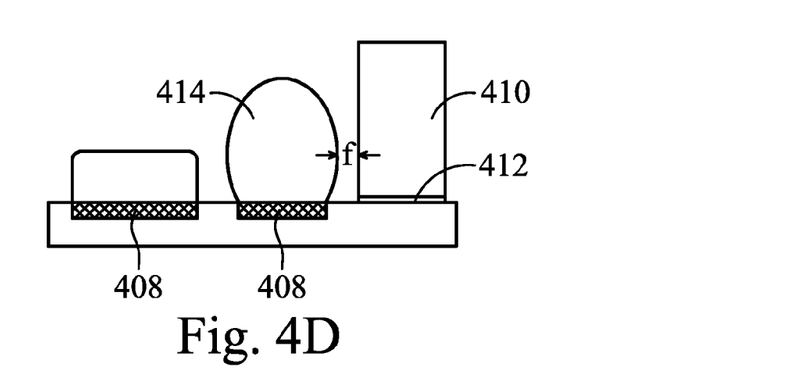

When a liquid optical polymer, such as a spin or glass or a sol-gel polymer, is dispensed over this workpiece 400, the hydrophilic interface causes the liquid to self-align to the surface treated regions 408 (FIG. 4C). In FIG. 4D, an optical fiber 410 can then be attached to the substrate surface using epoxy 412, for example, at a desired distance, f, from ball lens 414 to provide good optical coupling.

Figure 5A:
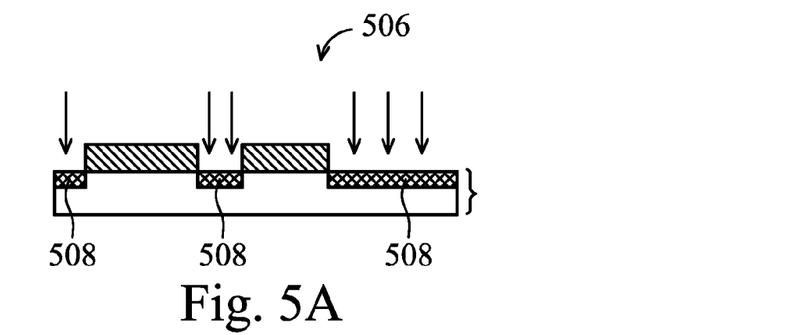
FIGS. 5A-5D show a series of cross-sectional views illustrating some embodiments of a method for manufacturing an optical device on a workpiece and connecting an optical fiber to the workpiece.
Figure 5B:
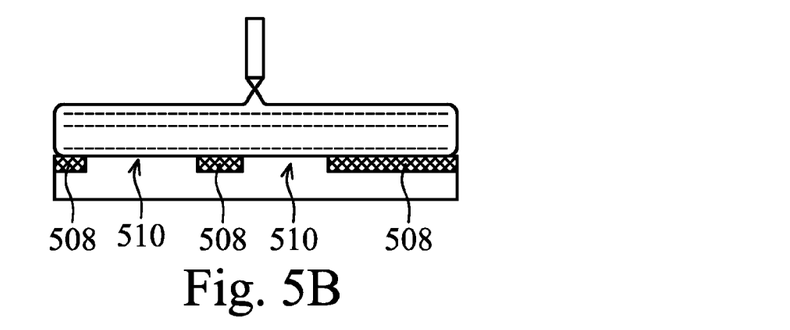
Figure 5C:
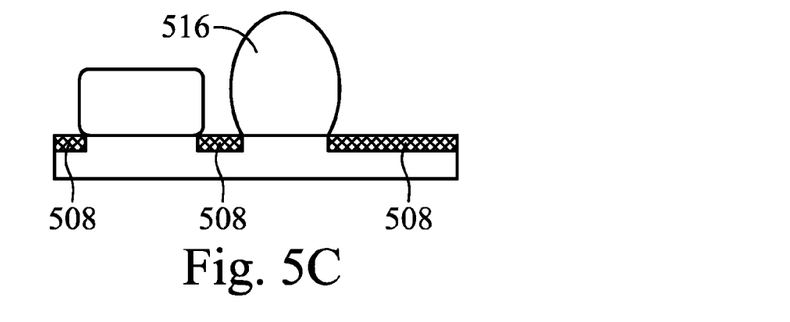
Figure 5D:
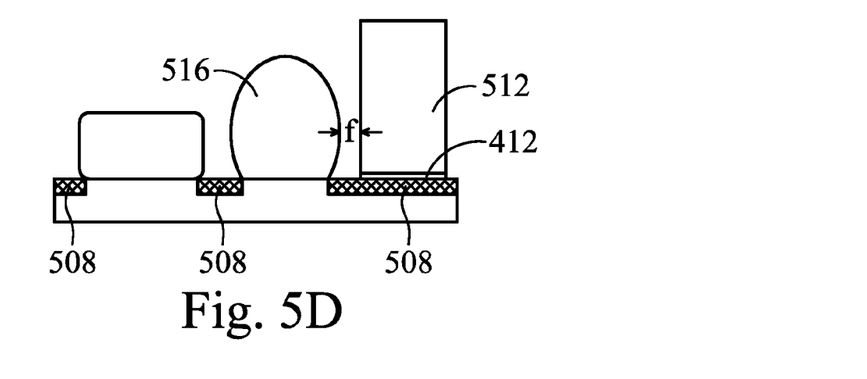

In FIG. 5A-5D, in contrast, the surface treatment 506 makes the surface treated regions 508 a hydrophobic interface that includes O—, NH3, and N2 atoms. A vapor treatment such as water vapor for oxidation might also be used. Because the surface treated regions 508 are hydrophobic, liquid, such as spin-on-glass or sol-gel, is repelled by the surface treated regions 508 and is thus self-aligned to the un-treated substrate surface 510 to from optical structures. In FIG. 5D, an optical fiber 512 can then be attached to the substrate surface 502A using epoxy 514, for example, at a desired distance, f, from the ball lens 516 to provide good optical coupling.

FIGS. 6A-6D show another embodiment of manufacturing of an optical structure, which is similar to FIG. 3 in some regards, but which attaches an optical fiber to the substrate as well.

Figure 6A:
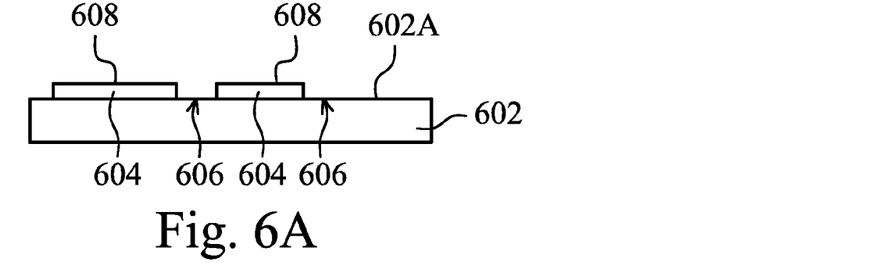
FIGS. 6A-6D show a series of cross-sectional views illustrating some embodiments of a method for manufacturing an optical device on a workpiece and connecting an optical fiber to the workpiece.

In FIG. 6A, the method starts with a workpiece, which includes a substrate 602 having a substrate surface 602A on which a landing layer 604 is formed. The landing layer 604 is typically formed by lithography techniques and is hydrophilic, relative to the substrate surface 602A (which is relatively hydrophobic).

Figures 6B, 6C:
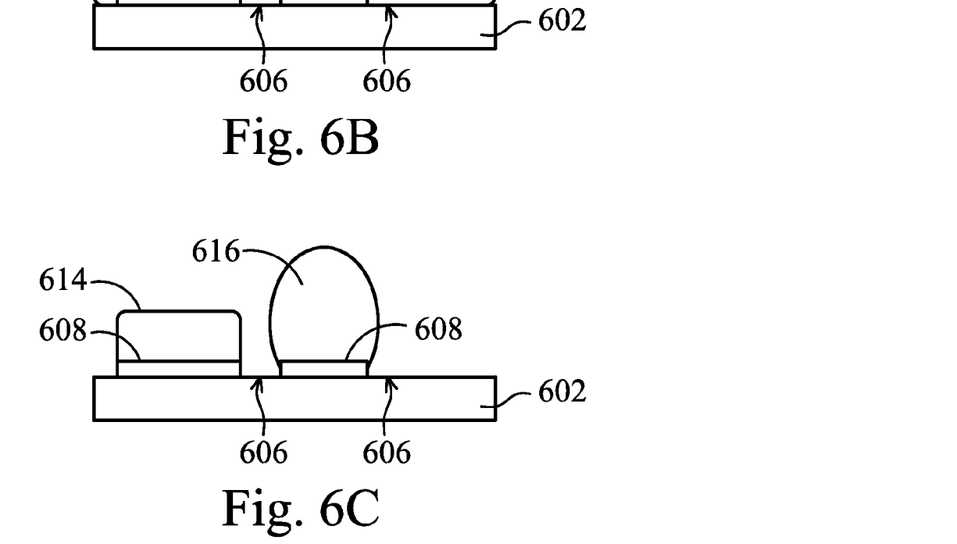

In FIG. 6B, a liquid corresponding to an optical component is dispensed over the exposed surface regions 606 and the landing surface regions 608.

Figure 6D:
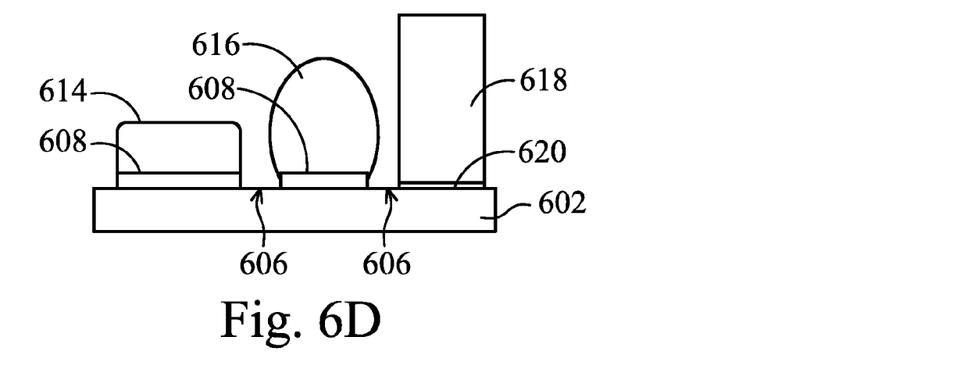
Figure 7A:
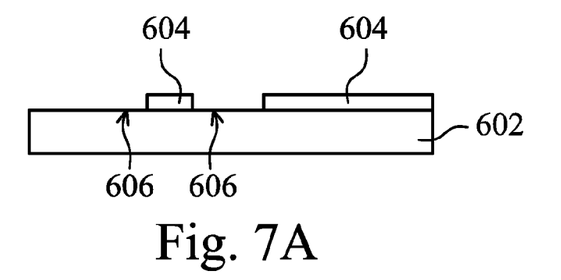
FIGS. 7A-7D show a series of cross-sectional views illustrating some embodiments of a method for manufacturing an optical device on a workpiece and connecting an optical fiber to the workpiece.
Figure 7B:
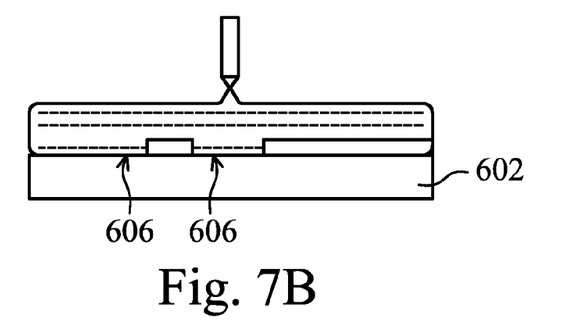
Figure 7C:
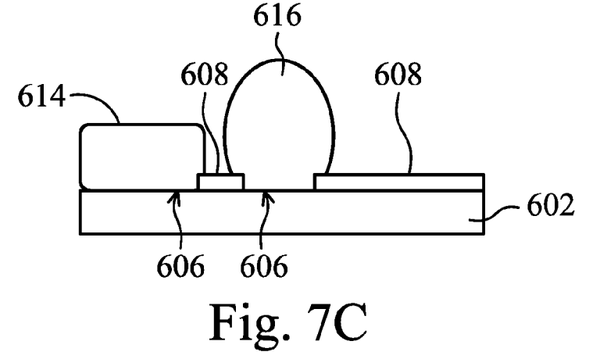
Figure 7D:
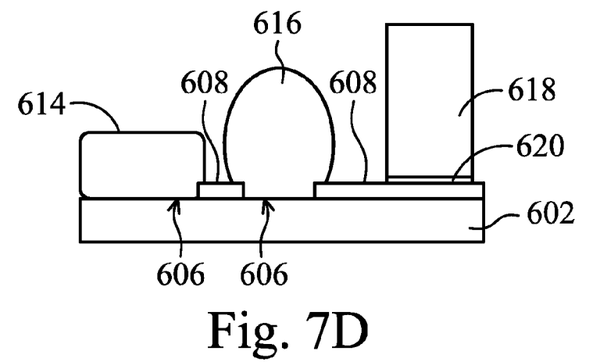

As shown in FIG. 6C, due to the wettability difference between the landing surface regions 608 and the exposed surface regions 606, the dispensed liquid tends to self-align with the landing surface regions 608. The self-aligned liquid is then hardened, for example by baking the self-aligned liquid at a low temperature and then performing a cure at a higher temperature, to form the optical structure. In the illustrated embodiment, the optical structure can correspond to a waveguide 614, which can be relatively box-like in shape, and lens(es) 616, each of which having a relatively spheroidical or dome-like in shape of a portion of a spheroid. In FIG. 6D, an optical fiber 618 can then be attached to the substrate surface using epoxy 620, for example, at a desired distance, f, from ball lens 616 to provide good optical coupling.

In FIG. 7A-7D, in contrast, the landing surface regions 604 are hydrophobic, relative to the exposed substrate surface 606 (which are relatively hydrophilic). Thus, the dispensed liquid tends to self-align to the exposed substrate regions 606 in this example, rather than to the landing surface regions 604. A variety of different surface topologies and materials are contemplated as falling within the scope of this disclosure. According to various embodiments of the present disclosure, the landing pads (e.g., exposed substrate regions 606) have similar surface characteristic as the lens material 616, but large contact angle contrast with surrounding area (604) to form self-aligned structures.

Thus, it will be appreciated that some embodiments relate to a method of processing a workpiece. The workpiece includes a first surface region having a first wettability coefficient, and a second surface region having a second wettability coefficient that differs from the first wettability coefficient. A liquid, which corresponds to an optical structure, is dispensed on the first and second surface regions of the workpiece, wherein the liquid self-aligns to the second surface region due to the difference between the first and second wettability coefficients. The self-aligned liquid is hardened to form the optical structure.

Other embodiments relate to an apparatus. The apparatus includes a substrate having first surface regions having a first wettability coefficient. Neighboring first surface regions are separated from one another by second surface regions having a second wettability coefficient that differs from the first wettability coefficient. Optical structures are formed over the substrate and are self-aligned to the first or second surface regions.

Still other embodiments relate to a method of forming an optical structure. In this method, a workpiece having an exposed surface is provided. The exposed surface includes a first surface region having a first wettability coefficient, and at least two second surface regions having a second wettability coefficient. The second wettability coefficient is different from the first wettability coefficient. A liquid, which corresponds to an optical structure, is dispensed on the exposed surface. Due to the difference between the first and second wettability coefficients, the liquid self-aligns to the at least two second surface regions.

It is to be understood that in the description of embodiments contained herein any direct connection or coupling between functional blocks, devices, components, circuit elements or other physical or functional units shown in the drawings or described herein could also be implemented by an indirect connection or coupling, i.e., a connection or coupling comprising one or more intervening elements. Furthermore, it should be appreciated that functional blocks or units shown in the drawings may be implemented as separate circuits in some embodiments, but may also be fully or partially implemented in a common circuit or common integrated circuit in other embodiments, or in some cases may also be implemented jointly by programming a processor accordingly.

It should be noted that the drawings are provided to give an illustration of some aspects and features of embodiments of the present invention and are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative location of the various components and elements shown. The features of the various embodiments described herein may be combined with each other. On the other hand, describing an embodiment with a plurality of features is not to be construed as indicating that all those features are necessary for practicing the present invention, as other embodiments may comprise less features and/or alternative features.

What is claimed is:

1. An apparatus, comprising:
   a substrate including a first surface region which separates neighboring second surface regions from one another, wherein the first surface region has a first wettability coefficient and the second surface regions have a second wettability coefficient, wherein the second wettability coefficient causes the second surface regions to be hydrophilic and the first wettability coefficient causes the first surface region to be hydrophobic relative to the second surface regions, wherein the first surface region corresponds to an upper surface of the substrate, and wherein the second surface regions comprise a landing pad surface having a different surface elevation relative to the upper surface of the substrate; and an optical structure which is arranged on at least one of the second surface regions but which does not cover the first surface region, the optical structure having sidewalls that are substantially aligned to an interface between the first and second surface regions.

2. The apparatus of claim 1, wherein the substrate is a glass substrate.

3. The apparatus of claim 2, wherein the landing pad surface comprises at least one of: spin-on-glass or a sol-gel polymer.

4. The apparatus of claim 1, wherein the neighboring second surface regions have a ball lens and a waveguide, respectively, arranged thereon, and wherein the neighboring second surface regions are spaced apart by the first surface region which has a length that is approximately equal to a focal length of the ball lens.

5. The apparatus of claim 4, wherein the interface between the first and second surface regions has a rectangular or square shape as viewed from above.

6. The apparatus of claim 1, wherein the second surface regions comprise a plasma-modified surface region which has been modified by a plasma-process, and wherein the first surface region comprises a substrate surface which has been un-modified by the plasma process.

7. The apparatus of claim 1, wherein the optical structure is arranged on the at least one landing pad surface.

8. An apparatus, comprising:
a substrate surface including a first surface region having a first wettability coefficient and a second surface region having a second wettability coefficient, wherein the second wettability coefficient causes the second surface region to be hydrophilic and the first wettability coefficient causes the first surface region to be hydrophobic relative to the second surface region, wherein the second surface region includes first and second sub-region surfaces which are separated from one another by the first surface region, and wherein the first and second sub-region surfaces have first and second lengths, respectively, wherein the first length is different from the second length, and wherein the first and second sub-region surfaces have a different surface elevation relative to an upper surface of the first surface region;

a first optical structure on the first sub-region surface; and
a second optical structure on the second sub-region surface.

9. The apparatus of claim 8, wherein the first optical structure is an optical lens that promotes propagation of at least one pre-determined wavelength of electromagnetic radiation therethrough.

10. The apparatus of claim 9, wherein the second optical structure is an optical waveguide.

11. The apparatus of claim 9, wherein a length of the first surface region, which laterally separates the first and second sub-region surfaces, corresponds to a focal length associated with the optical lens.

12. The apparatus of claim 8, wherein the substrate surface is a glass substrate.

13. The apparatus of claim 8, wherein at least one of the first or second sub-region surfaces has a rectangular or square shape as viewed from above.

14. An apparatus, comprising:
a substrate including: a lens surface region, a waveguide surface region, and a surface region separating the lens surface region from the waveguide surface region; wherein the surface region has a first wettability coefficient, and wherein the lens surface region and waveguide surface region both have a second wettability coefficient, wherein the second wettability coefficient causes the lens surface region and the waveguide surface region to be hydrophilic and the first wettability coefficient causes the surface region to be hydrophobic relative to the lens surface region and the waveguide surface region, wherein the surface region corresponds to an upper surface of the substrate, and wherein the lens surface region and the waveguide surface region have a different surface elevation relative to the upper surface of the substrate;

a ball lens arranged on the lens surface region and having a first length along a first direction; and a waveguide arranged on the waveguide surface region and having a second length along the first direction, wherein the second length is larger than the first length.

15. The apparatus of claim 14, wherein during manufacture the ball lens and waveguide self-align to the lens surface region and the waveguide surface region, respectively, due to the difference between the first and second wettability coefficients.

16. The apparatus of claim 14, wherein the surface region separates the lens surface region from the waveguide surface region by a focal length of the ball lens.

17. The apparatus of claim 14, wherein the substrate is a glass substrate.

18. The apparatus of claim 14, wherein at least one of the lens surface region or the waveguide surface region has a rectangular or square shape as viewed from above, and wherein the first and second lengths are each measured on a line which is co-planar with the lens and waveguide surface regions and which perpendicularly intersects a side of the rectangular or square shape.

19. The apparatus of claim 14, wherein the lens surface region and the waveguide surface region have been treated by a plasma-process, and wherein the surface region has been un-treated by the plasma process to provide the first and second wettability coefficients.

20. The apparatus of claim 14, wherein the first and second wettability coefficients are achieved by:
forming a mask layer over the upper surface of the substrate;

patterning the mask layer to cover one of the surface region or the lens and waveguide surface regions while exposing the other of the surface region or the lens and waveguide surface regions; and carrying out a surface treatment while the mask layer is in place to change the wettability of the other of the surface region or the lens and waveguide surface regions, relative to the one of the surface region or the lens and waveguide second surface regions.

* * * * *